US009255969B2

United States Patent
Basu et al.

(10) Patent No.: US 9,255,969 B2
(45) Date of Patent: Feb. 9, 2016

(54) PROGNOSTICS AND LIFE ESTIMATION OF ELECTRICAL MACHINES

(75) Inventors: Wrichik Basu, Bangalore (IN); Somakumar Ramachandrapanicker, Bangalore (IN); Dhaval Chandubhai Patel, Bangalore (IN); Demetrios Karambatos, Toronto (CA); Robert Charles Deveaux, Stouffville (CA); David John Allcock, Markham (CA); Arijit Banerjee, Cambridge, MA (US)

(73) Assignee: General Electric Company, Niskayuna, NY (US)

( * ) Notice: Subject to any disclaimer, the term of this patent is extended or adjusted under 35 U.S.C. 154(b) by 889 days.

(21) Appl. No.: 13/476,545

(22) Filed: May 21, 2012

(65) Prior Publication Data

US 2013/0311113 A1 Nov. 21, 2013

(51) Int. Cl.
*G01R 31/00* (2006.01)
*G01R 31/34* (2006.01)

(52) U.S. Cl.
CPC .................. *G01R 31/343* (2013.01)

(58) Field of Classification Search
None
See application file for complete search history.

(56) References Cited

U.S. PATENT DOCUMENTS

| | | | |
|---|---|---|---|
| 6,295,510 B1 * | 9/2001 | Discenzo | H02K 11/001 310/50 |
| 6,611,771 B1 * | 8/2003 | Habetler et al. | 702/58 |
| 8,903,664 B2 * | 12/2014 | Desabhatla | 702/58 |
| 2004/0076872 A1 | 4/2004 | Kinoshita et al. | |
| 2007/0182357 A1 | 8/2007 | Schrepfer | |
| 2007/0285097 A1 | 12/2007 | Zettel et al. | |
| 2008/0216576 A1 | 9/2008 | Eckert et al. | |
| 2010/0169030 A1 * | 7/2010 | Parlos | 702/58 |
| 2010/0194323 A1 * | 8/2010 | Premerlani et al. | 318/490 |
| 2010/0312744 A1 | 12/2010 | Prokhorov et al. | |

FOREIGN PATENT DOCUMENTS

| | | |
|---|---|---|
| CN | 101038639 A | 9/2007 |
| CN | 201000476 Y | 1/2008 |
| CN | 201690222 U | 12/2010 |
| TW | 201024757 A | 7/2010 |

OTHER PUBLICATIONS

G. C. Stone; "The Statistics of Aging Models and Practical Reality"; Electrical Insulation; IEEE Transactions on vol. 28, Issue: 5; Publication Year: 1993; pp. 716-728.

Thomas W. Dakin; "Electrical insulation deterioration treated as a chemical rate phenomenon"; Transactions of the American Institute of Electrical Engineers, vol. 67, Issue: 1; Publication Year: 1948; pp. 113-122.

Saha et al.; "Uncertainty Management for Diagnostics and Prognostics of Batteries using Bayesian Techniques", Aerospace Conference, 2008 IEEE; pp. 1-8.

* cited by examiner

*Primary Examiner* — Aditya Bhat
(74) *Attorney, Agent, or Firm* — Nitin N. Joshi

(57) ABSTRACT

The method includes measuring an operating parameter comprising at least one of a phasor current and phasor voltage of an electrical machine. The method further includes determining a diagnostic parameter indicative of a fault of the electrical machine based on the measured operating parameter. The method also includes estimating end of life of the electrical machine based on the diagnostic parameter using an error minimization method.

20 Claims, 8 Drawing Sheets

PROGNOSTICS AND LIFE ESTIMATION OF ELECTRICAL MACHINES

BACKGROUND

The subject matter disclosed herein generally relates to electrical machines. More specifically, the subject matter relate to methods and systems for detecting potential faults and prediction of End of Life (EoL) of electrical machines.

Electric machines such as generators and motors are subjected to failure due to factors such as aging, severe operating conditions and hostile environments. Downtime caused by an unexpected failure of electric machines reduces productivity and profitability.

Rectifying faults and replacing the machines before the failure during a planned maintenance schedule is preferred, but leads to increased costs when machines are replaced or repaired prematurely. Access to historical repair information allows an understanding of the conditional failure probabilities of components of electrical machines. But, failure patterns vary significantly from the published data depending on the ratings and other attributes related to the electrical machines. Failures are also influenced by the specific operating parameters and environment such that generalized data is not highly illustrative. According to industry standards, almost one half of the total failures for electric motors are bearing-related failures. Additionally, one third or more failures are typically related to the winding insulation and iron core failures.

There is a need for an enhanced system and method for detecting potential faults and predict EoL in electrical machines.

BRIEF DESCRIPTION

In accordance with one aspect of the present technique, a method is disclosed. The method includes measuring an operating parameter comprising at least one of a phasor current and phasor voltage of an electrical machine. The method further includes determining a diagnostic parameter indicative of a fault of the electrical machine based on the measured operating parameter. The method also includes estimating end of life of the electrical machine based on the diagnostic parameter using an error minimization method.

In accordance with one aspect of the present systems, a system is disclosed. The system includes a current sensor for measuring a phasor current of an electrical machine, a voltage sensor for measuring a phasor voltage of the electrical machine and a fault estimation module communicatively coupled to the current sensor and the voltage sensor. The fault estimation module is configured to determine a diagnostic parameter indicative of a fault of the electrical machine based on at least one of the measured phasor current and the phasor voltage. The fault estimation module is further configured to estimate end of life of the electrical machine based on the diagnostic parameter using an error minimization method.

In accordance with another aspect of the present technique, a non-transitory computer readable medium encoded with a program to instruct a processing unit is disclosed. The program instructs the processing unit to measure an operating parameter comprising at least one of a phasor current and a phasor voltage of an electrical machine and to determine a diagnostic parameter indicative of a fault of the electrical machine based on the measured operating parameter. The program further instructs the processing unit to estimate end of life of the electrical machine based on the diagnostic parameter using an error minimization method.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Embodiments of the present system relate to life estimation of electrical machines and predicting "end of life" for such machines using normalized parameters estimated from measured voltage and current at the terminals of the machine. Depending upon the time trending of the normalized parameter, an estimated time is predicted that will be required for the normalized parameters to reach a limit of safe operating condition. In certain embodiments, an associated method includes measuring an operating parameter including at least one of a phasor voltage and phasor current of an electrical machine. A diagnostic parameter indicative of a fault of the electrical machine is determined based on the one or more measured parameters. Life of the electrical machine is estimated based on extrapolation of the diagnostic parameter using an error minimization method.

Figure 1:
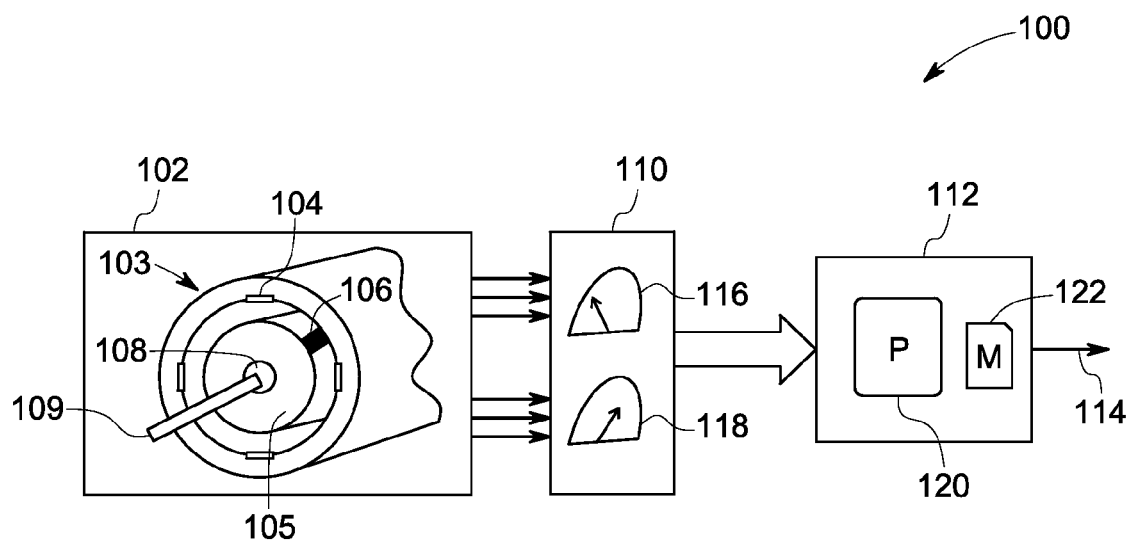
FIG. 1 is a diagrammatic illustration of a system used for prognosis and life estimation of an electrical machine, in accordance with an exemplary embodiment.

FIG. 1 is a diagrammatic illustration of a prognostic system 100 for determining an End of Life (EoL) of an electrical machine 102. The electrical machine 102 may include but not limited to electric motor, electric generator, electrical transformer, induction motor, and the like. The electrical machine 102 may be a polyphase electrical machine or a single phase electrical machine. Typically, the rotating electrical machine 102, such as a motor or a generator, develop faults in a stator 103, a rotor 105, and/or in one or more bearings 108. Some exemplary failure modes are provided herein.

"Stator turn faults" in the stator 103 may be caused by, for example, a short-circuit of a few turns of a stator winding 104. Electrical machine behavior due to stator turn faults depend upon the fault location and the number of short-circuited turns due to the distributed nature of the stator windings in the machine. The stator turn faults are typically difficult to locate within the windings 104 which makes it hard to predict when the stator 103 will fail.

The rotor 105 typically includes one or more rotor bars 106 that are oriented about the rotor. Rotor bars 106 tend to carry significant current causing heating and expansion of the bars. The differences in the electrical resistance of the individual rotor bars 106 can result in uneven heating and uneven expansion of the rotor bars, leading to cracking of one or more joints where the bars 106 are welded to a shorting ring. As soon as a crack develops in the rotor bar 106, the resistance of the rotor bar 106 increases which increases the heating and consequently worsening of the crack, resulting in a "broken bar fault".

The bearings 108 of the machine 102 are typically used in conjunction with a rotating shaft 109 to allow the shaft to freely rotate. "Bearing defects" refer to a pit or a missing piece of material on any of the bearing parts. The bearing defects lead to a failure of the machine.

The prognostic system 100 further includes sensing unit 110 having at least one voltage sensor 116 and at least one current sensor 118, to measure operating parameters of the electrical machine 102. The sensing unit 110 may be mounted on the machine or in close proximity of the machine 102. The operating parameters may be at least one of a phasor voltage and phasor current. The voltage sensor 116 measure phasor voltage and the current sensor 118 measure phasor current of the electrical machine 102. The phasor voltages and phasor currents may be measured at the terminals of the electrical machine.

A fault estimation module 112 receives the operating parameters measured by the sensors 116, 118 and processes the data to generate an "End of Life" (EoL) estimate 114 corresponding to the electrical machine 102. The fault estimation module 112 in one embodiment includes a processing unit 120 and a memory module 122 to predict the life of the electrical machine 102.

The processing unit 120 may be a controller, a general purpose processor or an embedded system with one or more cores. The processing unit 120 may receive additional inputs from a user through a input device such as a keyboard or a control panel. The memory module 122 may be random access memory (RAM), read only memory (ROM), flash memory, or other type of computer readable memory accessible by the processing unit 120. The memory module 122 may be encoded with a program to instruct the processing unit 120 to enable a sequence of steps to estimate life 114 of the electrical machine 102. The EoL estimate 114 can be communicated to an operator or processed such that the optimal timeframe to repair or replace the machine is accommodated.

In one embodiment the fault estimation module 112 is co-located with the sensing unit 110. In another embodiment the fault estimation module 112 is located apart from the sensing unit 110 and communicatively coupled to the fault estimation module 112. For example, the sensing unit 110 may include a transmitter or transceiver to send the data to the fault estimation module 112.

Figure 2:
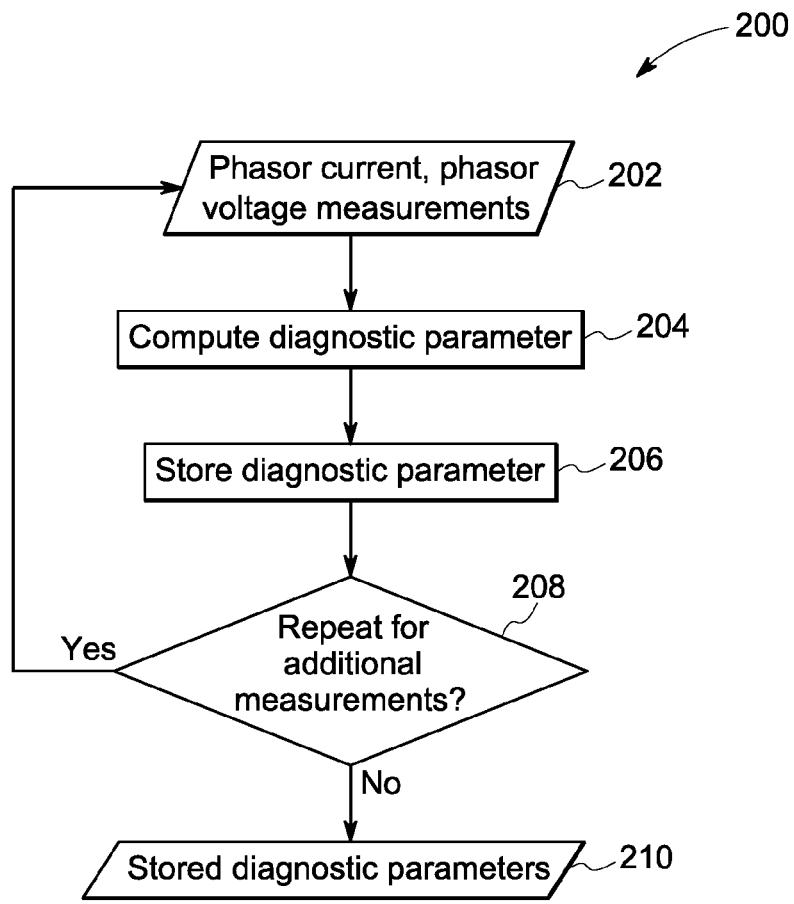
FIG. 2 is a flow chart that illustrates determining a diagnostic parameter indicative of a fault in an electrical machine in accordance with an exemplary embodiment.

FIG. 2 is a flow chart illustrating an exemplary method 200 for determining a diagnostic parameter indicative of a fault of an electrical machine. The method 200 includes measuring operating parameters including at least one of phasor voltage and phasor current 202. A diagnostic parameter is computed 204 based on at least one of the measured phasor voltage and phasor current, wherein the diagnostic parameter is computed for a particular instant of time 204.

According to one embodiment the computed diagnostic parameter is stored in a memory module of the fault estimation module 206. The process can be repeated 208 for additional measurements, if available. Thus in one example the electrical machine continues to operate, and additional phasor current and/or phasor voltage measurements are acquired 202. In one example the number of repeated measurements and processing can be continuous, a fixed number, based on measured values, based on the computed diagnostic parameter and/or based on user input.

The system computes the additional diagnostic parameter 204 and logs the diagnostic parameter 206. In one example, a plurality of phasor voltages and phasor currents are used in computing the diagnostic parameter. However, it is not necessary to sense every phasor voltages and phasor currents to determine every diagnostic parameter. For example, while determining a potential stator turn fault, three phasor voltages and three phasor currents may be needed. While determining some other potential fault, for example broken bar faults, only one of the phasor currents may be sufficient. In some embodiments, along with the measured phasor voltages and phasor currents, additional parameters can be used to generate the result. For example, additional parameters such as a rating of the electrical machine, ambient temperature, or the like may be used when computing the diagnostic parameter.

A plurality of diagnostic parameters representing values for a particular instant of time can be processed and stored in memory 210. The stored diagnostic parameters in one example are accessible by the fault estimation module for processing using an EoL estimation technique to process the EoL estimation.

The diagnostic parameter in one example may be indicative of at least one of the stator turn fault, rotor bar fault, or bearing fault of the electrical machine. In one embodiment, the diagnostic parameter is a cross coupled impedance indicative of a stator turn fault in an electrical machine. In another embodiment, the diagnostic parameter is a spectral peak indicative of a broken bar fault. In yet another embodiment, the diagnostic parameter is a Root Mean Square (RMS) value indicative of a bearing fault. In certain other embodiments, the diagnostic parameter may include other parameters capable of effectively diagnosing a particular potential fault of an electrical machine. In one example the diagnostic parameter is associated with a particular type of fault. A value associated with the diagnostic parameter may be used to indicate the severity of the fault. In one embodiment, the lower values of the determined cross coupled impedance of an electrical machine may indicate a one-turn fault, whereas higher values of the cross coupled impedance may indicate a three-turn fault. In another embodiment, pertaining to a potential bearing fault, lower RMS values may be indicative of a wobble whereas higher RMS values may be indicative of an outer race fault. In yet another embodiment, lower amplitude values for the spectral peak may indicate one broken bar fault and higher amplitude values may indicate three broken bar faults. Various embodiments of determining the diagnostic parameters are explained with reference to subsequent figures.

Figure 3:
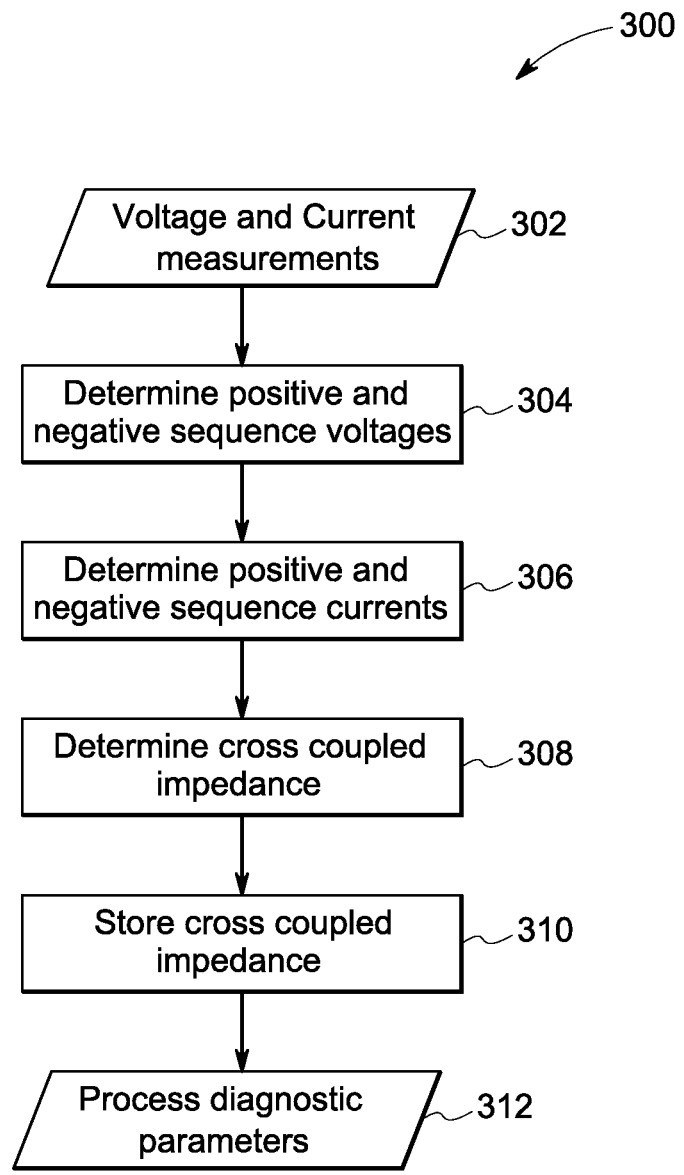
FIG. 3 is a flow chart that illustrates determining a cross-coupled impedance indicative of a stator turn fault for an electrical machine in accordance with an exemplary embodiment.

FIG. 3 is a flow chart illustrating an exemplary method 300 for determining a cross-coupled impedance indicative of a stator turn fault. The method includes measuring operating parameters such as voltage and current measurements 302. In one example the measurements are three phasor voltages and three phasor currents of the electrical machine. A positive sequence voltage and a negative sequence voltage are determined using the measured phasor voltages 304. Denoting phasor voltages as $V_{ab}$, $V_{bc}$, and $V_{ca}$, the positive sequence voltage is represented by, $$V_p = \frac{V_{ab} + aV_{bc} + a^2 V_{ca}}{3} \quad (1)$$

Where a is a constant equal to $e^{(i\,2\pi i/3)}$.
Similarly, the negative sequence voltage is represented by, $$V_n = \frac{V_{ab} + a^2 V_{bc} + aV_{ca}}{3} \quad (2)$$

A positive sequence current and a negative sequence current are determined based on the measured phasor currents 306. Denoting phasor currents as $I_a$, $I_b$, and $I_c$, positive sequence current $I_p$ and negative sequence current $I_n$ are represented by, $$I_p = \frac{I_a + aI_b + a^2 I_c}{3} \quad (3)$$

$$I_n = \frac{I_a + a^2 I_b + aI_c}{3} \quad (4)$$

Based on the computed voltages and currents represented by Equations. 1-4, a cross coupled impedance is computed 308. Using vector notations for determined voltage and current measurements and using symmetrical component theory, $$\begin{bmatrix} V_p \\ V_n \end{bmatrix} = \begin{bmatrix} Z_{pp} & Z_{pn} \\ Z_{np} & Z_{nn} \end{bmatrix} \begin{bmatrix} I_p \\ I_n \end{bmatrix} \quad (5)$$

where
$Z_{pp}$ is the positive sequence impedance,
$Z_{nn}$ is the negative sequence impedance,
$Z_{pn}$ and $Z_{np}$ are cross coupled impedances.
From equation (5), negative sequence voltage is represented by:

$$V_n = Z_{np} I_p + Z_{nn} I_n \quad (6)$$

From equation (6), $$\frac{Z_{np}}{Z_{nn}} = \frac{\left(\frac{V_n}{Z_{nn}} - I_n\right)}{I_p} \quad (7)$$

The "cross coupled impedance" denoted by the term ($Z_{np}/Z_{nn}$) is a diagnostic parameter indicative of stator turn faults. In certain embodiments, the negative sequence impedance required to compute the cross coupled impedance can be computed based on the rating information of the electrical machine as represented by the equation: $Z_{nn}$=f (HorsePower, Voltage, Pole, Frequency, Size). According to one example, the computed cross coupled impedance is stored in memory such as in the fault estimation module 310. In an alternate embodiment, another variant of the cross coupled impedance represented by ($Z_{np}/Z_{pp}$) may also be used as a diagnostic parameter to determine the potential stator turn faults. The diagnostic values are processed 312 by the processing unit to determine EoL estimation. The diagnostic parameters in one example are stored and processed while in another embodiment the diagnostic parameters are dynamically processed.

The cross coupled impedance is one technique to detect a variety of potential stator turn faults. The value of the cross coupled impedance during normal operation of the electrical machine may be recorded. Similarly, the value of the cross coupled impedance for various stator turn faults may be established by means of experimentation. Based on the outcome of a baseline experimentation, thresholds $T_1$ and $T_2$, may be determined. The stator turn fault condition may be determined using, but not limited to, the following rules, $$\text{Healthy Motor if } \frac{Z_{np}}{Z_{pp}} < T_1, \quad (8)$$

$$\text{one turn fault if } T_1 \leq \frac{Z_{np}}{Z_{pp}} < T_2,$$

$$\text{two turn fault if } T_2 \leq \frac{Z_{np}}{Z_{pp}}.$$

Figure 4:
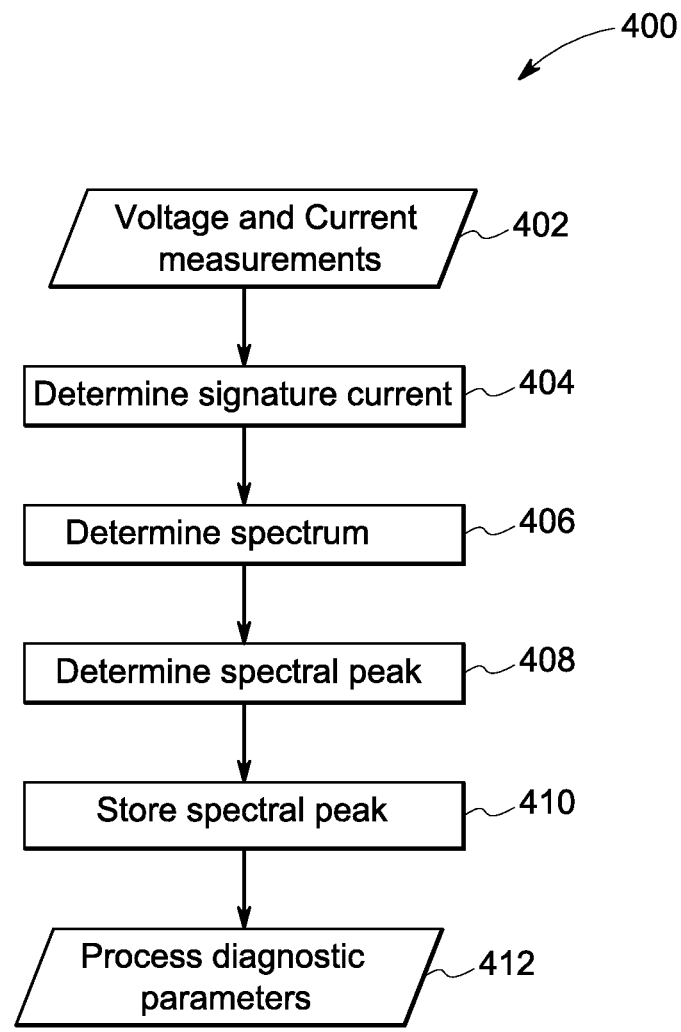
FIG. 4 is a flow chart that illustrates determining spectral peaks of a sideband indicative of a rotor bar fault in an electrical machine in accordance with an exemplary embodiment.

FIG. 4 is a flow chart illustrating an exemplary method 400 of determining a diagnostic parameter indicative of a rotor bar fault in an electrical machine. The method includes measuring operating parameter such as voltage and current measurements 402. In one example the measurements include phasor voltages and phasor currents of the electrical machine. In the illustrated embodiment, a signature current is determined based on the measured phasor currents 404. In certain embodiments, each phasor current may be used as a "signature current". In some embodiments, one or more phasor currents may also be processed further to derive a signature current.

A spectrum is then determined based on the signature current 406. In one embodiment, the spectrum may be a frequency spectrum derived using Fourier transformation. In certain other embodiments, other types of frequency transformation may be used to determine the spectrum. A spectral peak in the sideband of the spectrum is determined 408. Normalized values of the spectral peak can be stored in memory such as the memory module 410. The normalized values are used as a diagnostic parameter indicative of rotor bar faults. The diagnostic values 412 are used by the processing unit to determine EoL estimation.

Denoting signature current by $I_s$, the spectrum of the signature current is computed as $$I_{sf}(f) = FFT(I_s(t)). \quad (9)$$

Frequency spectrum of the phasor current is normalized by the magnitude of the phasor current at fundamental frequency as, $$I_{sfn}(f) = (I_{sf}(f)/I_{sf}(0)). \quad (10)$$

The magnitude of the side band peaks is considered as the parameter signifying the rotor bar fault at a time instant t. It is denoted by the term $$I_{sfmax\,n}(t) = \max I_{sfn}(f) \quad (11)$$

Where, $0 < f < f_s$, fs being the first harmonic frequency.
The spectral peak $I_{sfmaxn}(t)$ as a diagnostic parameter indicative of a potential rotor bar fault may be used to detect the rotor bar fault.

The spectral peak can be used to detect a variety of broken bar faults. The value of the magnitude of the spectral peak during normal operation of the electrical machine may be recorded. Similarly, the value of the spectral peak for various broken bar faults may be established by means of experimentation. Based on the outcome of a baseline experimentation, thresholds $T_3$, $T_4$ may be determined. The broken bar potential fault condition may be determined using but not limited to the following rules;

healthy rotor if $I_{sfmax\,n}(t) < T_3$, one broken bar fault if $T_3 \leq I_{sfmax\,n}(t) < T_4$, two broken bars fault if $T_4 \leq I_{sfmax\,n}(t)$. (12)

Figure 5:
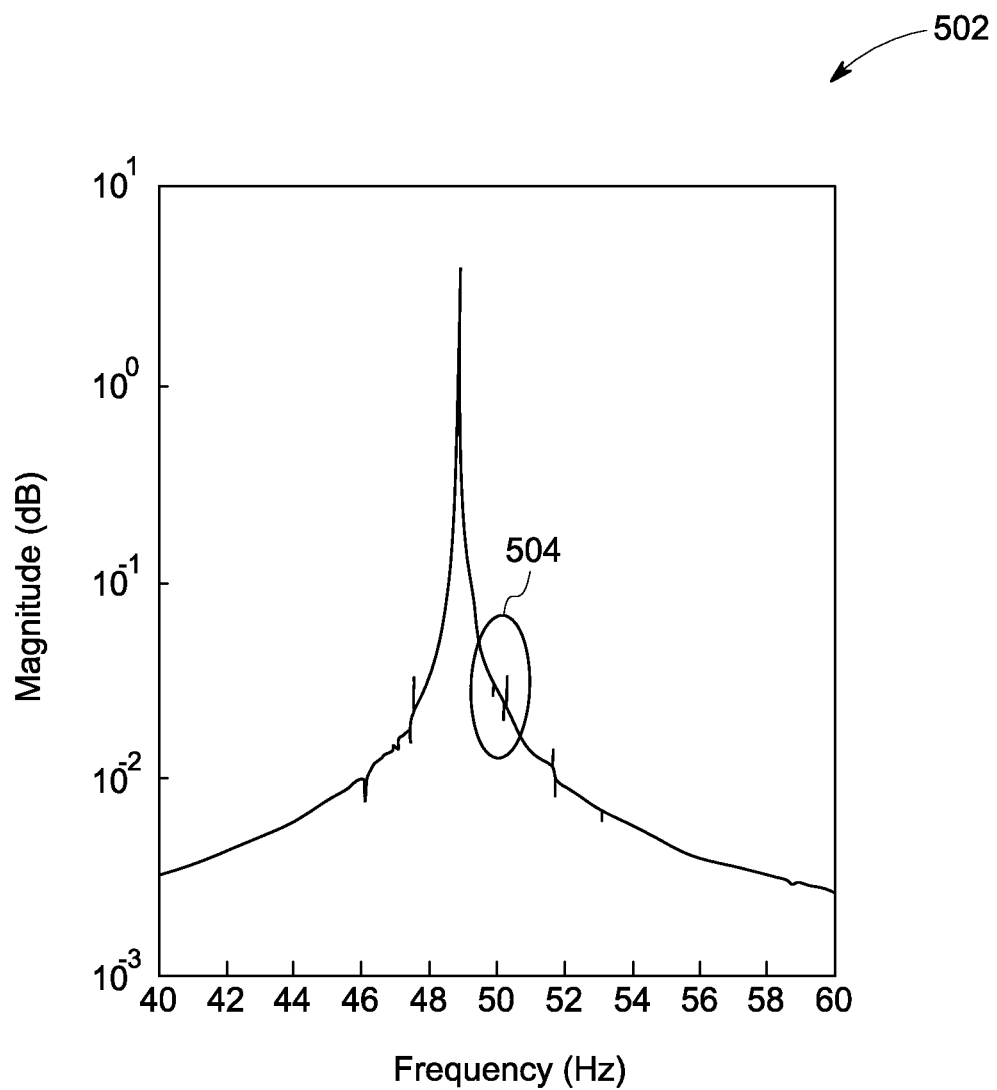
FIG. 5 is a graphical representation of a spectrum determined based on the signature current in accordance with an embodiment of FIG. 4.

Referring to FIG. 5, a spectrum 502 is computed 406 (indicated in FIG. 4) and is depicted graphically. In the illustrated graph, the x-axis is represented by frequency (measured in Hertz) of the signature current and the y-axis is represented by the amplitude (measured in decibels) of the signature current. A spectral peak of a sideband of the spectrum 502 is represented by 504. The magnitude of this spectral peak is considered as a diagnostic parameter indicative of a potential rotor bar fault.

Figure 6:
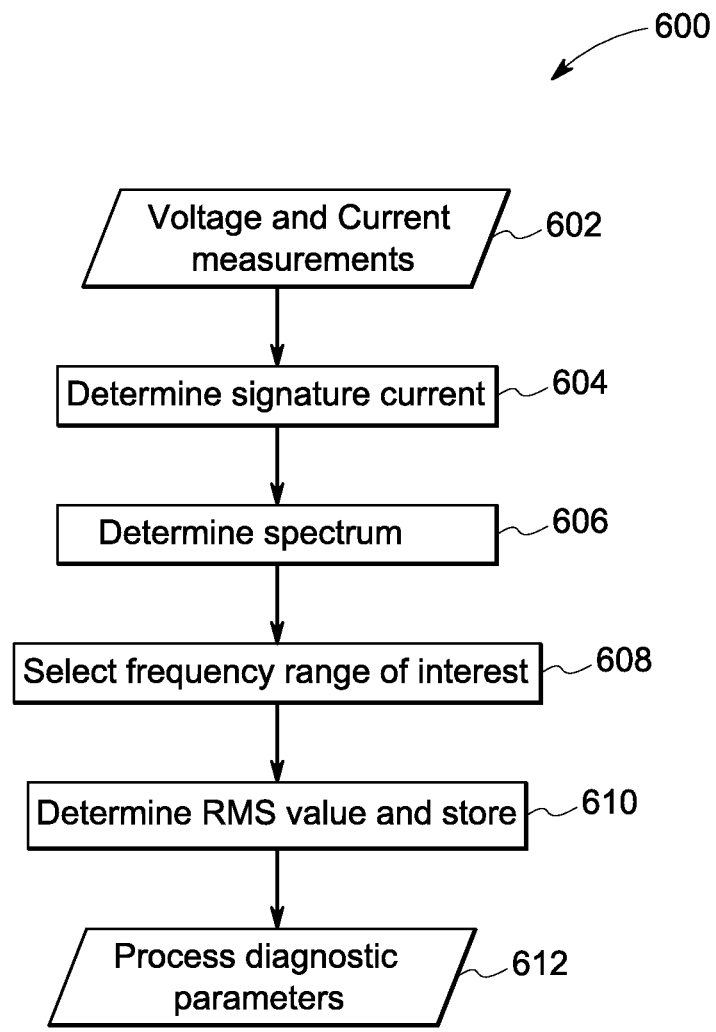
FIG. 6 is a flow chart that illustrates determining Root Mean Square (RMS) value of a sideband spectrum indicative of bearing faults in an electrical machine in accordance with an exemplary embodiment.

FIG. 6 is a flow chart illustrating an exemplary method 600 for determining a diagnostic parameter indicative of a bearing fault in an electrical machine. The method includes measuring operating parameter such as voltage and current measurement 602. In one example the measurement include phasor voltages and phasor currents of the electrical machine. A signature current is determined based on the measured phasor currents 604. In certain embodiments, each of the phasor currents may be used as a "signature current". In certain other embodiments, one or more phasor currents may be processed further to obtain the signature current. In a specific embodiment, any two of the phasor currents may be multiplied to obtain a signature current. A spectrum of the signature current is determined 606. The spectrum may be a frequency spectrum. In certain embodiments, a Fourier transformation technique is employed to determine the spectrum of the signature current. In other embodiments, other frequency transformations may be used. A particular frequency band based on a range of interest is selected from a side band of the spectrum 608. The choice of the frequency band in certain examples may be dependent on the type of bearing fault under consideration. In this embodiment a Root Mean Square (RMS) value is determined based on the samples of the spectrum of the signature current in the chosen frequency band 610. The RMS value of the spectrum can be stored in a memory. The RMS value is used as a diagnostic parameter indicative of a bearing fault of the electrical machine and processed for the EoL estimation 612.

Denoting the frequency range corresponding to a particular bearing fault as $F=[f_1\ f_2]$, and using the of Eq. (9), the spectrum corresponding to the bearing fault is represented by, $I_{sF}=I_s(f)/I_s(0)$, where $f_1 < f < f_2$ (13)

and $I_s(0)$ is the normalization factor. Depending on the type of bearing fault, the range of frequency may change. The spectrum in the selected frequency range may be normalized by the current at the fundamental frequency. Normalizing the selected frequency range by the current at the fundamental frequency, the EoL estimate is made independent of the operating load. Assuming that there are n samples in the chosen frequency band F of the spectrum $I_{sf}$, the RMS value which is a diagnostic parameter indicative of a bearing fault is represented by:

$$E = \left[\frac{1}{(n2-n1+1)}\sum_{n=n1}^{n2} I_{sF}(n^2)\right]^{1/2} \quad (14)$$

where, n1 and n2 are indices of the first and the last samples of the frequency window F under consideration. The RMS value E is used as a diagnostic parameter indicative of a bearing fault.

The RMS value denoted by E may be used to determine the bearing fault of various types. RMS values of the electrical machine during normal operation as well as during various faulty conditions are recorded. Based on these baseline experimentations, bearing faults are determined based on but not limited to the following rules;

Healthy bearing $E < T_5$,

Wobbling fault $T_5 \leq E < T_6$,

Roughness fault $T_5 \leq E < T_7$,

Outer race fault $T_7 \leq E < T_8$, (15)

where thresholds $T_5$, $T_6$, $T_7$ and $T_8$ are determined by baseline experimentations.

In the various embodiments discussed herein for determining a diagnostic parameter, various pre-determined thresholds are used to determine various potential stator turn, rotor bar, and bearing faults. These pre-determined thresholds in some embodiments are based on factors such as the rated life of the electrical machine, type of application, required safety margin and the performance degradation of the electrical machine. The diagnostic parameter may be normalized so that the thresholds need not be varied across machines of different ratings. Normalized diagnostic parameters ensure reliability of End of Life (EoL) estimation that is determined when the machine is operated at different loads.

Figure 7:
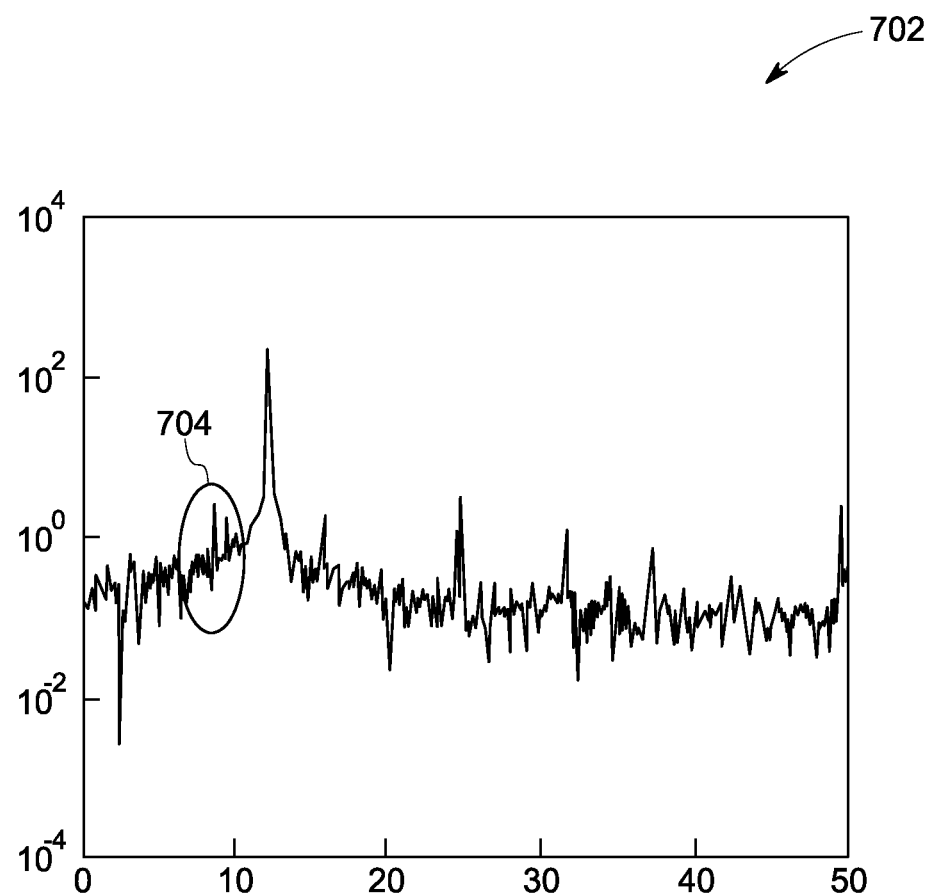
FIG. 7 is a graphical representation of a frequency spectrum of a signature current in accordance with an embodiment of FIG. 6.

Referring to FIG. 7, a frequency spectrum of a signature current 702 as computed from step 606 (indicated in FIG. 6) is depicted graphically. In the illustrated graph, x-axis is represented by frequency (measured in Hertz) of the signature current and y-axis is represented by the amplitude (measured in decibels) of the signature current. The frequency band corresponding to a bearing fault is shown by the reference numeral 704. The samples of the frequency band is used to determine an energy value which will be considered as a diagnostic parameter indicative of potential bearing fault of the electrical machine.

Figure 8:
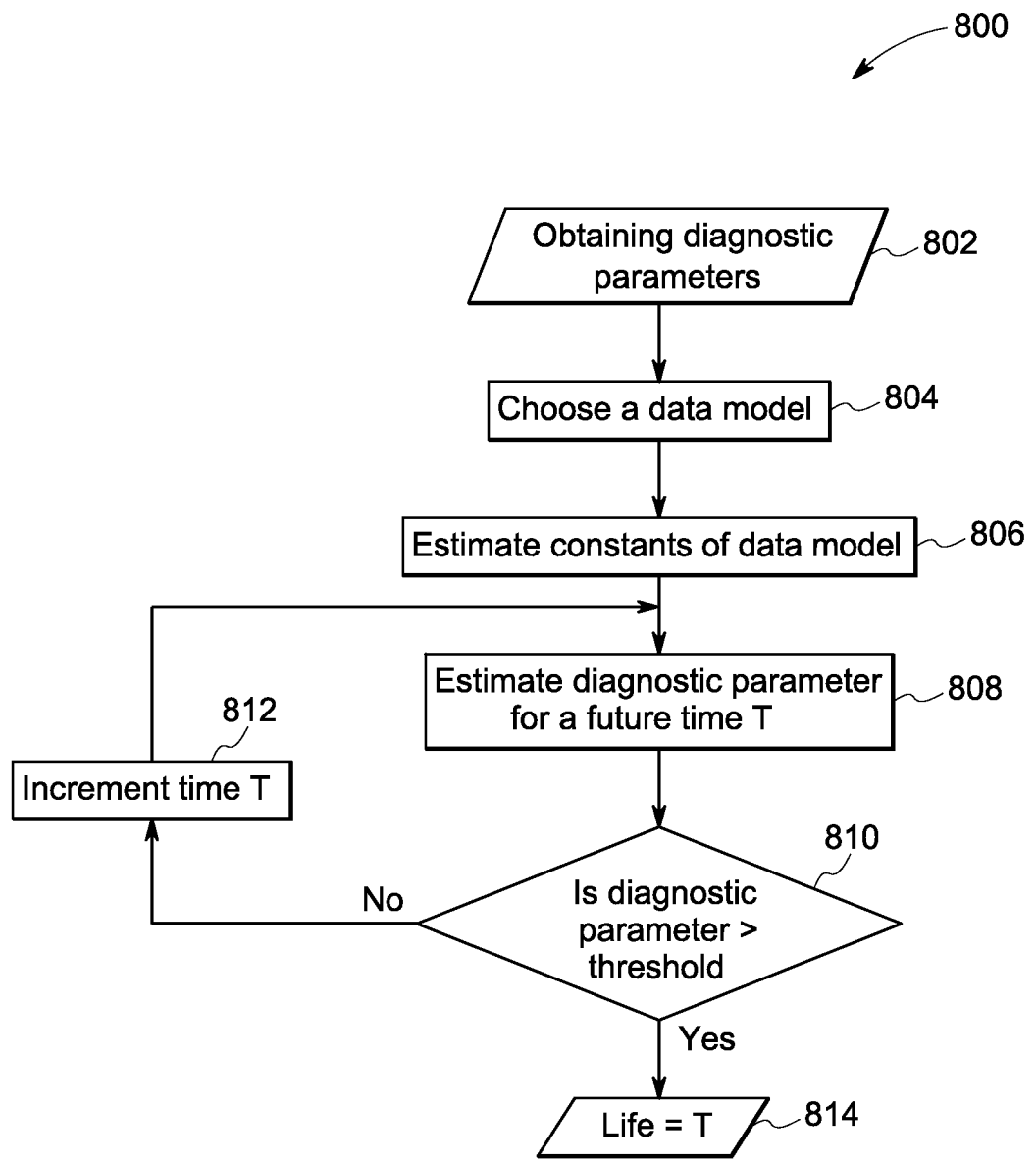
FIG. 8 is a flow chart that illustrates determining a life estimate of an electrical machine in accordance with an exemplary embodiment.

FIG. 8 a flow chart illustrating an exemplary method 800 for determining an End of Life (EoL) of an electrical machine. During the operation of the electrical machine, diagnostic parameters are computed at various instance of time and are stored in memory of the fault detection module or otherwise communicated to the fault estimation processing unit. The fault estimation module obtain the one or more diagnostic parameters 802 for processing the EoL estimation. To determine an EoL of the machine through a prediction method, a data model for the diagnostic parameter is chosen 804. In an exemplary embodiment, an exponential model is chosen as the data model for the diagnostic parameter. In other embodiments, other models may also be used. For example, a polynomial model may be used as a data model. Constants of the chosen data model are estimated based on the stored diagnostic parameters 806. An error minimization method may be used to determine the constants of the data model. In one embodiment, a Least Squares (LS) minimization method is employed for estimating the constants of the data model. In another embodiment, a Weighted Least Squares (WLS) method may be used. In yet another embodiment, an absolute error is used in the error minimization method to estimate the constants of the model.

The diagnostic parameter for a future instant of time is estimated based on estimated constants of the data model 808. Estimated future value of the diagnostic parameter is compared with a pre-determined threshold 810. If the estimated future value is not greater than a pre-determined threshold value, the future value is incremented 812 and again the step of estimating the diagnostic parameter 808 is repeated. When the estimated future value parameter exceeds the pre-determined threshold value, the time value corresponding to the estimated diagnostic parameter is determined as the EoL of the rotating electrical machine 814.

The method of determining an EoL of an electrical machine can be initiated with choosing a data model for the diagnostic parameter. In the exemplary embodiment the diagnostic parameter is an exponential model represented as:

$$Z(n) = ae^{bnT} \quad (16)$$

where Z(n) is a diagnostic parameter at a time instant n, a and b are model constants and T is the sampling time period.

Considering present values of diagnostic parameters Z(n), Z(n−1) ... Z(n−k), corresponding to k samples of time, model constants a and b could be determined by Least Means Squares minimization given by $$\text{Minimize}\left(\sum_{p=n-k}^{n}(Z(p) - ae^{bpT})^2\right) \quad (17)$$

where p is a running sample index. From the estimated constants a and b, a future value of the diagnostic parameter at an instance of time n+m may be determined as, $$Z(n+m) = ae^{b(n+m)T}. \quad (18)$$

When, Z(n+m−1)<Thr<Z(n+m), where Thr is a pre-determined threshold, the time m is declared as EoL of the electrical machine.

Figure 9:
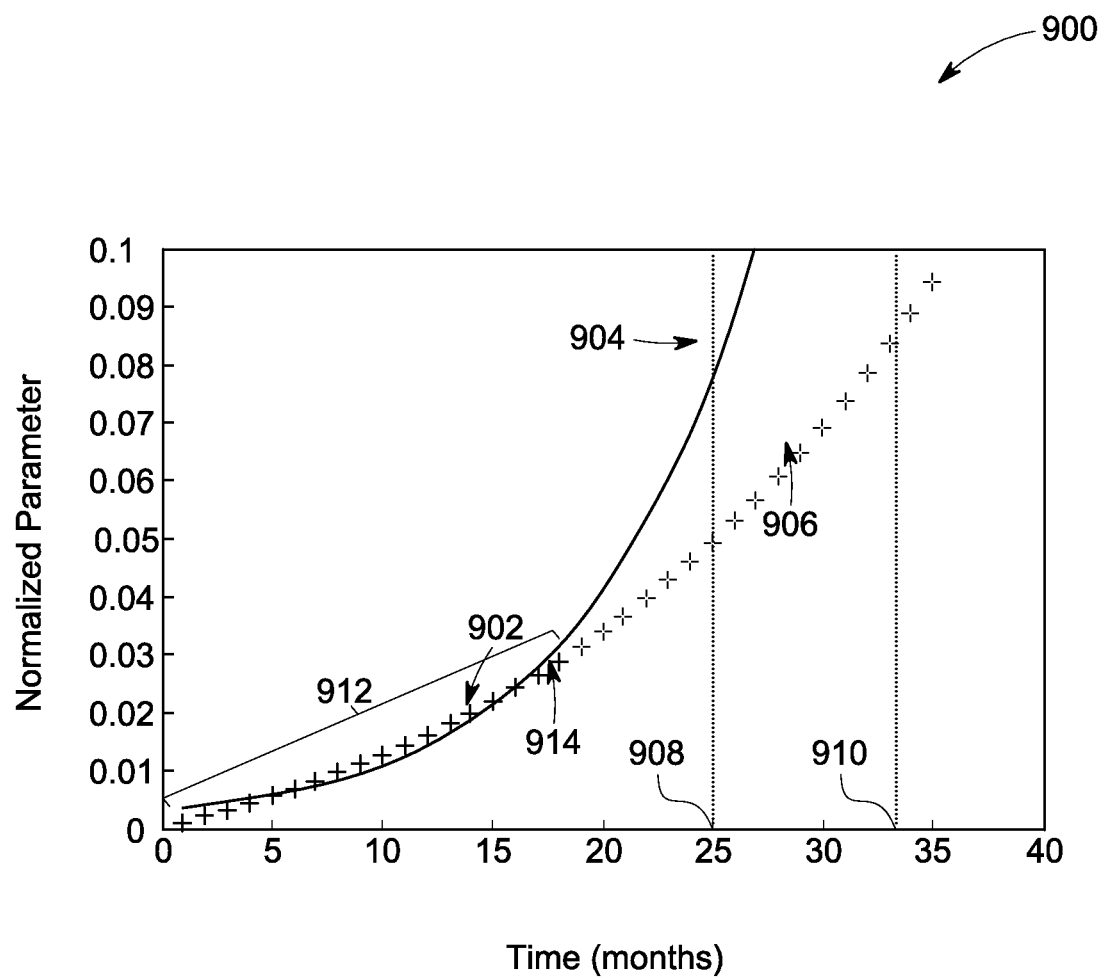
FIG. 9 is a graph depicting estimation of life of an electrical machine in accordance with an exemplary embodiment.

Referring to FIG. 9, estimation of EoL is represented by a graph 900. In the illustrated graph, x-axis is represented by time of operation of an electrical machine and y-axis is represented by the normalized diagnostic parameter. Curve 904 depicts future values of the diagnostic parameter as determined by the exponential model. The curve 906 depicts actual progression of the diagnostic parameter. The two curves 904 and 906 overlaps as depicted by the curve segment 902 highlighted by region 912. Region 912 extending from origin to a point 914 of the curve 902 is representative of a set of present values of the diagnostic parameter determined based on the measured current and voltages. These present values are used to determine the constants of the exponential model. The time instant 908 corresponding to the curve 904 is indicative of estimated EoL. The time instant 910 corresponding to the curve 906 is indicative of actual EoL.

In accordance with the embodiments discussed herein, an estimate of the time of failure of an electrical machine may be obtained based on the exemplary estimation of EoL. The EoL estimate may be represented graphically or by any other means suitably to the end user. It may also be used to automatically alter the operating conditions of the electrical machine. The estimate may be used to avoid downtime of the electrical machine. In one embodiment, EoL estimate may be used to decide the maintenance schedule of an electrical machine. In another embodiment, the machine may be operated at a reduced load until a next maintenance schedule. In certain embodiments, a load at which the machine may be operated may be determined based on the EoL estimate.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method, comprising:
   measuring an operating parameter comprising at least one of a phasor current and phasor voltage of an electrical machine;
   determining a diagnostic parameter indicative of a fault of the electrical machine based on the measured operating parameter by computing a plurality of present values indicative of the diagnostic parameter, each present value corresponding to a time instant during operation of the electrical machine;
   selecting a data model for the diagnostic parameter;
   estimating at least one constant of the data model based on the plurality of present values indicative of the diagnostic parameter;
   estimating a future value indicative of the diagnostic parameter using the at least one estimated constant of the data model;
   estimating end of life of the electrical machine when the future value exceeds a pre-determined threshold value; and
   controlling the operating parameter of the electrical machine based on the estimated end of life.

2. The method of claim of 1, wherein the phasor current is a three phasor current and the phasor voltage is a three phasor voltage, and wherein determining the diagnostic parameter comprises:
   determining a positive sequence voltage and a negative sequence voltage based on the measured three phasor voltage;
   determining a positive sequence current and a negative sequence current based on the measured three phasor current; and
   determining a cross-coupled impedance indicative of the fault of at least one stator winding of the electrical machine, based on the determined positive sequence voltage, the negative sequence voltage, the positive sequence current and the negative sequence current.

3. The method of claim of 1, wherein determining the diagnostic parameter comprises:

determining a signature current based on the measured phasor current;

determining a frequency spectrum based on the signature current; and determining a spectral peak value indicative of the fault of a rotor bar of the electrical machine based on a sideband of the frequency spectrum.

4. The method of claim of 1, wherein determining the diagnostic parameter comprises:

determining a signature current based on the measured phasor current;

determining a frequency spectrum based on the determined signature current;

selecting a frequency band corresponding to a fault of a bearing of the electrical machine, from a sideband of the frequency spectrum; and determining a Root Mean Square (RMS) value indicative of the fault of the bearing based on a plurality of sample values of the selected frequency band.

5. The method of claim 1, wherein the fault associated with the electrical machine comprises at least one of a stator fault, a rotor bar fault, and a bearing fault.

6. The method of claim 1, wherein the diagnostic parameter comprises at least one of across coupled impedance, a spectral peak magnitude, and an RMS value based on the measured operating parameter of the electrical machine.

7. The method of claim 1, further comprising normalizing the diagnostic parameter.

8. The method of claim 1, wherein the data model is an exponential model.

9. The method of claim 1, further comprising determining the pre-determined threshold value based on plurality of factors comprising a rated life of the electrical machine, type of application, required safety margin, degradation of the electrical machine.

10. The method of claim 1, further comprising determining the data model based on a Least Squares (LS) method or a Weighted Least Squares (WLS) method.

11. A system comprising:

a current sensor for measuring a phasor current of an electrical machine;

a voltage sensor for measuring a phasor voltage of the electrical machine; and a fault estimation module communicatively coupled to the current sensor and the voltage sensor and configured to:

determine a diagnostic parameter indicative of a fault of the electrical machine based on at least one of the measured phasor current and the phasor voltage by computing a plurality of present values indicative of the diagnostic parameter, each present value corresponding to a time instant during operation of the electrical machine;

select a data model for the diagnostic parameter;

estimate at least one constant of the data model based on the plurality of present values indicative of the diagnostic parameter;

estimate a future value indicative of the diagnostic parameter using the at least one estimated constant of the data model;

estimate end of life when the future value indicative of the diagnostic parameter exceeds a pre-determined threshold value; and control at least one of the phasor current and the phasor voltage of the electrical machine based on the estimated end of life.

12. The system of claim 11, further comprising a memory communicatively coupled with the fault estimation module and capable of storing the diagnostic parameter.

13. The system of claim 11, wherein the fault comprises at least one of a stator turn fault, a rotor bar fault, and a bearing fault.

14. The system of claim 11, wherein the fault estimation module is configured to compute the diagnostic parameter comprising at least one of a cross coupled impedance, a spectral peak magnitude, an RMS value based on at least one of the measured current and voltage of the electrical machine.

15. The system of claim 11, wherein the fault estimation module is configured to estimate the data model for the diagnostic parameter.

16. The system of claim 11, wherein the phasor current is a three phasor current and the phasor voltage is a three phasor voltage, wherein the fault estimation module is further configured to:

determine a positive sequence voltage and a negative sequence voltage based on the measured three phasor voltages;

determine a positive sequence current and a negative sequence current based on the measured three phasor currents;

determine a cross coupled impedance indicative of the fault of at least one stator winding of the electrical machine, based on the determined positive sequence voltage, negative sequence voltage, positive sequence current and the negative sequence current.

17. The system of claim 11, wherein the fault estimation module is further configured to:

determine a signature current based on the measured phasor current;

determine a frequency spectrum based on the signature current;

determine a spectral peak value indicative of the fault of a rotor bar of the electrical machine based on a sideband of the frequency spectrum.

18. The system of claim 11, wherein the fault estimation module is further configured to:

determine a signature current based on the measured phasor current;

determine a frequency spectrum based on the determined signature current;

select a frequency band corresponding to a fault of a bearing of the electrical machine, from a sideband of the frequency spectrum;

determine a Root Mean Square (RMS) value indicative of the fault of the bearing based on a plurality of sample values of the selected frequency band.

19. The system of claim 11, wherein the fault estimation module is further configured to normalize the diagnostic parameter.

20. A non-transitory computer readable medium encoded with a program to instruct a processing unit to:

measure an operating parameter comprising at least one of a phasor current and a phasor voltage of an electrical machine;

determine a diagnostic parameter indicative of a fault of the electrical machine based on the measured operating parameter by computing a plurality of present values indicative of the diagnostic parameter, each present value corresponding to a time instant during operation of the electrical machine;

select a data model for the diagnostic parameter;

estimate at least one constant of the data model based on the plurality of present values indicative of the diagnostic parameter;

estimate a future value indicative of the diagnostic parameter using the at least one estimated constant of the data model;

estimate end of life of the electrical machine when the future value exceeds a pre-determined threshold value; and control the operating parameter of the electrical machine based on the estimated end of life.

* * * * *